United States Patent [19]
Ohannes et al.

[11] Patent Number: 5,204,554
[45] Date of Patent: Apr. 20, 1993

[54] PARTIAL ISOLATION OF POWER RAILS FOR OUTPUT BUFFER CIRCUITS

[75] Inventors: James R. Ohannes, Portland; Stephen W. Clukey, South Portland; E. David Haacke, Westbrook; Roy L. Yarbrough, Hiram, all of Me.

[73] Assignee: National Semiconductor Corporation, Santa Clara, Calif.

[21] Appl. No.: 802,747

[22] Filed: Dec. 6, 1991

[51] Int. Cl.$^5$ ............................................. H03K 17/16
[52] U.S. Cl. ................................. 307/443; 307/296.1
[58] Field of Search .................. 307/296.1, 296.4, 443, 307/475; 323/364, 369

[56] References Cited

U.S. PATENT DOCUMENTS

| | | | |
|---|---|---|---|
| 4,855,863 | 9/1989 | Yoshitake | 361/56 |
| 5,049,763 | 9/1991 | Rogers | 307/443 |
| 5,065,224 | 11/1991 | Fraser et al. | 357/70 |
| 5,121,036 | 6/1992 | Fuji | 307/296.1 |

FOREIGN PATENT DOCUMENTS 86901518.0 2/1986 European Pat. Off. .
57-164548 4/1981 Japan .

Primary Examiner—David R. Hudspeth
Assistant Examiner—Benjamin D. Driscoll
Attorney, Agent, or Firm—Daniel H. Kane; James W. Rose; Richard C. Calderwood

[57] ABSTRACT

An output buffer circuit (10) delivers output signals of high and low potential levels at an output ($V_{OUT}$) in response to data signals at an input ($V_{IN}$). The output buffer circuit comprises an input stage (12) coupled between a relatively quiet power supply rail ($V_{CCQ}$) and a relatively quiet power ground rail (GNDQ), and an output stage (14) coupled between a relatively noisy power supply rail ($V_{CCN}$) and a relatively noisy power ground rail (GNDN). A first coupling resistor (R5) is coupled between the relatively quiet and noisy supply rails ($V_{CCQ}$, $V_{CCN}$) for reducing $V_{CC}$ droop in the relatively noisy supply rail ($V_{CCN}$) which in turn reduces output step in voltage during transition from low to high potential level (LH) at the output ($V_{OUT}$). A second coupling resistor (R5A) is coupled between the relatively quiet and noisy ground rails (GNDQ,GNDN). The coupling resistors (R5 and R5A) have low resistance values selected for partially coupling the supply and ground rails respectively, while maintaining partial isolation for protecting input dynamic threshold levels of quiet outputs. The first coupling resistor (R5) is coupled between supply rail bond pads (20,22), while the second coupling resistor (R5A) is coupled between ground rail bond pads (30,32). The power rail bond pads (20,22) (30,32) are coupled respectively to split leads (24,25) (34,35) of a split lead leadframe merging respectively to a common $V_{CC}$ pin (28) and a common GND pin (38).

20 Claims, 5 Drawing Sheets

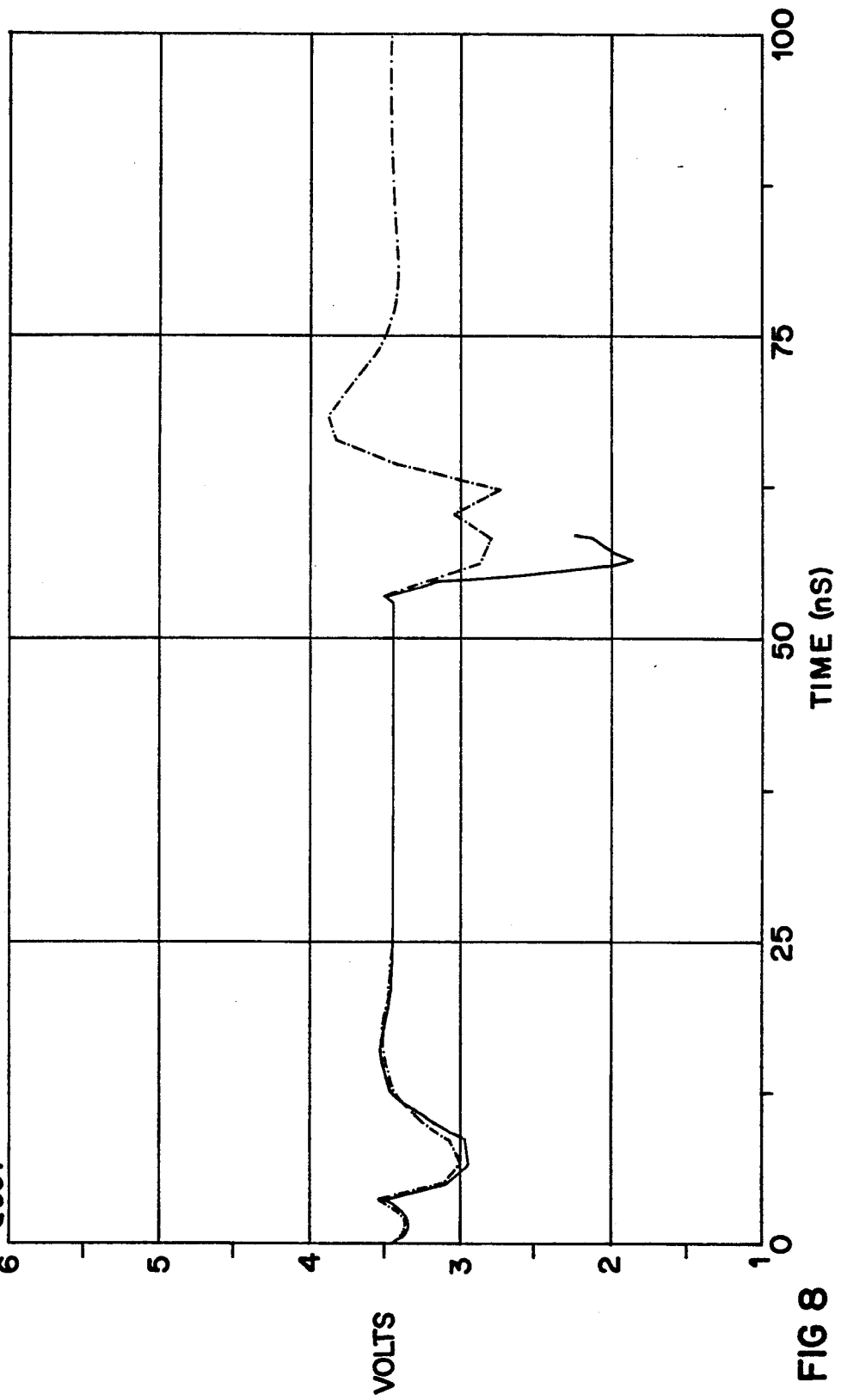

5,204,554

PARTIAL ISOLATION OF POWER RAILS FOR OUTPUT BUFFER CIRCUITS

CROSS REFERENCE TO RELATED PATENT APPLICATIONS

This invention is related to the James R. Ohannes, Stephen W. Clukey, E. David Haacke, Roy L. Yarbrough, Susan M. Keown, and Michael G. Ward U.S. patent application Ser. No. 804,105 filed concurrently for BICMOS OUTPUT BUFFER CIRCUIT WITH CMOS DATA PATHS AND BIPOLAR CURRENT AMPLIFICATION. The invention is also related to other U.S. Patent Applications there referenced including the James R. Ohannes et al. U.S. patent application Ser. No. 803,466 filed concurrently for BICMOS OUTPUT BUFFER WITH NOISE REDUCTION CIRCUIT.

TECHNICAL FIELD

This invention relates to integrated circuit (IC) devices such as BICMOS output buffer circuits having relatively quiet and relatively noisy power rails coupled respectively to input and output stages of the device. The invention provides a new power rail coupling for partial isolation and partial coupling of the respective quiet and noisy power rails. The invention is intended for applications with multiple output buffer circuits such as octal buffer line drivers coupled to a common bus.

The new power rail coupling reduces $V_{CC}$ droop or $V_{CC}$ crash at the noisy supply rail caused by switching output buffer circuits during transitions at the output. As a result, the invention reduces output step in voltage during the LH and HL transition at the output. At the same time, the invention maintains the input dynamic switching threshold voltage level of a quiet or non-switching output buffer circuit coupled to the common bus to prevent false data signals.

BACKGROUND ART

A conventional power rail coupling for an output buffer circuit 10 is illustrated in FIGS. 1–3. The output buffer circuit 10 delivers output signals of high and low potential levels H,L at an output $V_{OUT}$ in response to data signals at an input $V_{IN}$. The output buffer circuit includes an input stage 12 coupled between a relatively quiet power supply rail $V_{CCQ}$ and a relatively quiet power ground rail GNDQ. An output stage 14 is coupled between a relatively noisy power supply rail $V_{CCN}$ and a relatively noisy power ground rail GNDN. By way of example, in the BICMOS output buffer circuits described in the related Patent Applications, the input stage 12 is composed of CMOS transistors providing a relatively high impedance input, while the output stage 14 is composed of bipolar transistors providing a relatively low impedance output.

The relatively quiet and noisy supply rails $V_{CCQ}$, $V_{CCN}$ are coupled to respective spaced apart bond pads 20,22 on the integrated circuit chip. The supply rail bond pads, 20,22 are in turn coupled by separate bonding wires to separate leadframe fingers 24,25 of the leadframe. Similarly the relatively quiet and noisy power ground rails GNDQ,GNDN are coupled to spaced apart bond pads 30,32 on the IC chip. The ground rail bond pads 30,32 are coupled by separate bonding wires to separate leadframe fingers 34,35 of the leadframe.

As shown in FIGS. 2 & 3, the leadframe may be a split lead leadframe with split power leads providing partial isolation of the relatively quiet and noisy power rails. In FIG. 2 the split leads 24,25 for the respective quiet and noisy supply rails $V_{CCQ}$, $V_{CCN}$, merge at a common segment 26 and common $V_{CC}$ pin 28 for coupling to the external power supply $V_{CC}$. In FIG. 3 the split leads 34,35 for the respective quiet and noisy ground rails GNDQ,GNDN merge at a common segment 36 and common GND pin 38 for coupling to external ground GND.

Such leadframe split leads or split leadframe fingers for relative isolation of internal and output supply rails and ground rails are further described in the Ray A. Mentzer et al. U.S. Pat. No. 5,065,224 issued Nov. 12, 1991 for LOW NOISE INTEGRATED CIRCUIT AND LEADFRAME, filed in the USPTO on Sep. 8, 1988, an FWC Continuation of U.S. patent application Ser. No. 880,407 for REDUCTION IN POWER RAIL PERTURBATION filed Jun. 30, 1986, now abandoned. Other types of split lead leadframes are described in the Natsui Japan Patent Document 57-164548 dated Oct. 9, 1982, and the Watanabe European Patent Application 86901518.0filed in the EPO Feb. 28, 1986, corresponding to International Application No. PCT/JP86/00106 published Sep. 12, 1986 as International Publication No. WO86/05322.

An equivalent circuit is shown in FIG. 2A for the split lead leadframe fingers 24,25 and common stem 26 for partial isolation of the relatively quiet and noisy supply rails $V_{CCQ}$, $V_{CCN}$. The split lead configuration partially isolates internal stages of the IC chip and input stage 12 from the noise problems caused by sourcing and sinking large currents at the output. These noise problems are analyzed in further detail in the Alan C. Rogers U.S. Pat. No. 5,049,763 issued Sep. 17, 1991 for ANTI-NOISE CIRCUITS.

Briefly, upon transition from low to high potential at the output, an output pullup transistor of the output stage 14 becomes conducting with a surge or acceleration of charge from the external power supply $V_{CC}$ to the output $V_{OUT}$ through the common lead inductance $L_{CV}$ of the common stem 26 of the split lead leadframe fingers 24,25, and the separate lead inductance $L_{NV}$ of the split lead 25. The split lead 25 becomes the relatively noisy power supply $V_{CCN}$. The parasitic inductive impedance and resulting voltage across the inductances $L_{CV}$, $L_{NV}$ causes transient drop in the noisy output supply rail $V_{CCN}$ of for example as great as 2.5 volts below the external power supply $V_{CC}$ voltage of 5 volts. This drop in the noisy power supply $V_{CCN}$ voltage level is referred to as $V_{CC}$ droop, $V_{CC}$ collapse and consequent $V_{OHV}$ at the output. $V_{CC}$ droop causes a corresponding delay in the LH voltage rise at the output $V_{OUT}$ which appears as a "step" in the output voltage wave form illustrated in the graph of FIG. 7 and referred to herein as "output step" in the voltage level transition. Only a substantially smaller $V_{CC}$ droop appears on the relatively quiet supply rail $V_{CCQ}$ split lead 24 because of the relative isolation of the $V_{CCQ}$ split lead 24 inductance $L_{QV}$ from the relatively noisy supply rail $V_{CCN}$ and split lead 25 inductance $L_{NV}$.

Deceleration of the initial surge of charge through the output pullup transistor of output stage 14 results in a following supply rail voltage overshoot in the relatively noisy supply rail $V_{CCN}$ split lead 25 of opposite polarity from $V_{CC}$ droop. Subsequent ringing may persist until the inertial energy of the supply lead inductances is dissipated in the output transistors and related circuit components. Similar noise problems appear on the power ground side of the output buffer circuit in the relatively noisy ground rail GNDN and corresponding split lead 35, referred to as ground bounce and undershoot further analyzed in U.S. Pat. No. 5,049,763 referenced above.

In addition to split lead leadframe configurations, integrated circuit chips and chip packages are also available with entirely separate quiet and noisy ground rails and leads and entirely separate quiet and noisy supply rails and leads for better separation. In such leadframes, internal and output ground rails GNDQ,GNDN are routed to external ground through entirely separate leadframe fingers and separate pins. Similarly internal and output supply rails are coupled to the external power supply through entirely separate leadframe fingers and pins. This increases the isolation or separation of relatively quiet and noisy power rails in comparison with the split lead leadframe configurations.

The prior art isolation of relatively quiet internal power rails from relatively noisy output power rails is advantageous particularly in circuit applications where multiple output buffers are coupled to a common bus. The relative isolation of the shared quiet and noisy output leads helps to preserve and maintain the input dynamic threshold voltage level of quiet or non-switching buffer circuits coupled to the common bus while other output buffer circuits are switching. Without sufficient isolation of the relatively quiet and noisy power rails, the resulting variation in the input dynamic threshold voltage level at which switching may occur at the quiet output buffer circuits may cause false signals at a quiet output $V_{QOUT}$.

By way of example, for the BICMOS output buffer circuits described in the related patent applications, the typical input dynamic threshold voltage level $V_T$ at which switching of the buffer circuit occurs is for example approximately 1.5 volts at the input $V_{IN}$. When the output buffer circuit is holding a high potential level signal H at the output $V_{QOUT}$, the input dynamic threshold voltage level $V_{IHD}$ may be in the range of between 1.5 to 2.0 volts. While the output buffer circuit is holding a low potential level signal L at the output ($V_{QOUT}$), the input dynamic threshold voltage level may be in the range of 0.8 to 1.5 volts at the input.

Without isolation, noise in the power rails may otherwise force the input dynamic threshold voltage level outside of the respective ranges causing switching events and false data signals at the output. For a high potential level signal H held at the output $V_{QOUT}$, a dip in voltage below, for example, 2 volts is a failure. Similarly for a low potential level signal L held at the output $V_{QOUT}$, a rise in output voltage above 0.8 volts is a failure.

While isolation of the power rails prevents such input dynamic threshold failures, it also accentuates $V_{CC}$ droop or $V_{CC}$ crash in the output supply rail $V_{CCN}$. The isolation of power rails also accentuates ground bounce in the relatively noisy ground rail GNDN. This is because parasitic inductance is increased by splitting and isolating the rails, thereby increasing parasitic noise. This in turn accentuates output step and consequent delay in LH or HL transitions at the output.

OBJECTS OF THE INVENTION

It is therefore an object of the present invention to provide a new power rail coupling for output buffer circuits and integrated circuit devices which reduces $V_{CC}$ droop and ground bounce for attenuating output step in the output voltage wave form during transitions at the output.

Another object of the invention is to provide a power rail coupling for output buffer circuits which maintains input dynamic threshold voltage levels of quiet or non-switching output buffer circuits coupled to a common bus within acceptable limits.

SUMMARY OF THE INVENTION

In order to accomplish these results the present invention provides a power rail coupling for an output buffer circuit with a first coupling resistor coupled between the relatively quiet and noisy power supply rails. The first coupling resistor has a low resistance value selected for partially coupling the supply rails to reduce $V_{CC}$ crash on the noisy power supply rail and thereby reduce output step in voltage during low to high transition at the output.

A feature of the invention is that the first coupling resistor provides a partial parallel coupling of the relatively quiet and noisy power supply rails to reduce parasitic inductance. At the same time, the first coupling resistor provides sufficient isolation of the relatively quiet and noisy power supply rails to maintain input dynamic threshold voltage levels of other non-switching quiet output buffer circuits coupled to a common bus within acceptable limits.

In the preferred example, the relatively quiet and noisy power supply rails are coupled respectively to spaced apart bond pads. The first coupling resistor is coupled between the supply rail bond pads.

Additionally, the invention may provide a second coupling resistor coupled between the relatively quiet and noisy power ground rails. The second coupling resistor has a low resistance value selected for partially coupling the ground rails to reduce ground bounce on the noisy ground rail and thereby reduce output step in voltage during high to low transitions at the output. A feature of the second coupling resistor is that it provides a partial parallel coupling of the relatively quiet and noisy power ground rails to reduce parasitic inductance. At the same time the second coupling resistor provides partial isolation between the relatively quiet and noisy ground rails to maintain input dynamic threshold voltage levels for other non-switching quiet output buffer circuits coupled to the common bus.

In the preferred example the relatively quiet and noisy power ground rails are coupled to respective spaced apart bond pads on the integrated circuit chip. The second coupling resistor is coupled between the ground rail bond pads.

Typically the power supply bond pads are coupled to split leads of a split lead leadframe merging to a common $V_{CC}$ pin. The ground rail bond pads are coupled respectively to split leads of a split lead leadframe merging to a common GND pin.

Other objects, features and advantages of the invention are apparent in the following specification and drawings.

BRIEF DESCRIPTION OF THE DRAWINGS

FIG. 8 is a graph comparing the output voltage at the output $V_{QOUT}$ of a quiet or non-switching output buffer circuit on the common bus with the power supply coupling according to the circuit of FIG.4/FIG.5 and a power supply coupling with the split leads shorted together.

DESCRIPTION OF PREFERRED EXAMPLE EMBODIMENTS AND BEST MODE OF THE INVENTION

Figure 1:
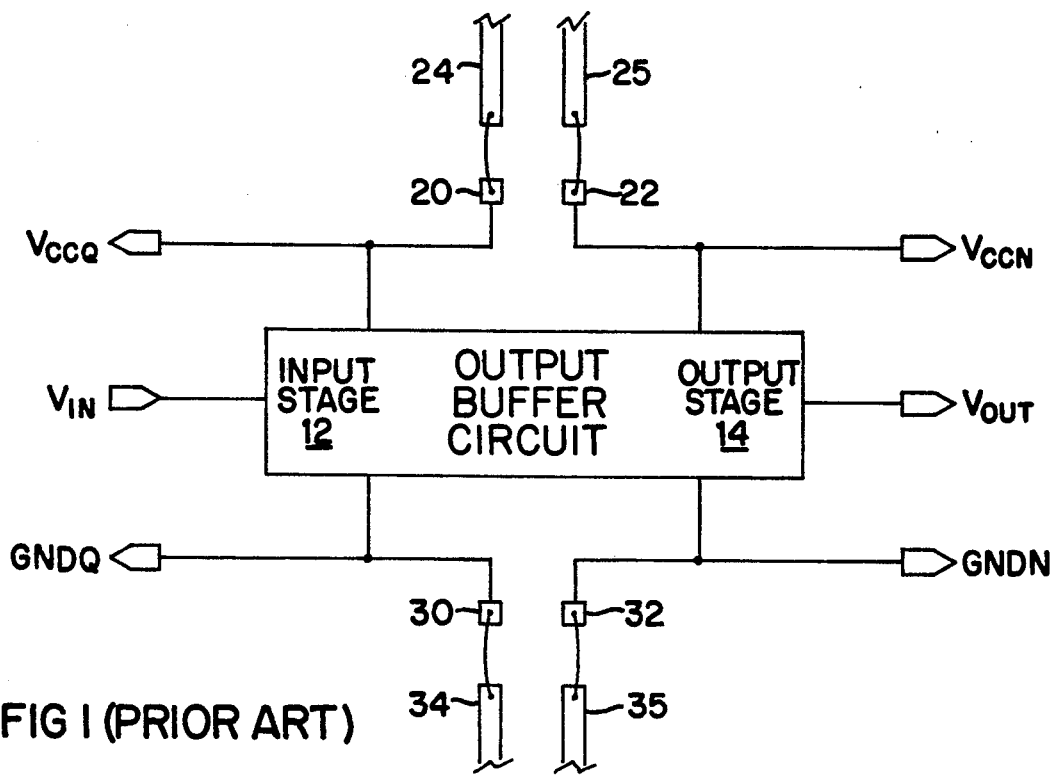
FIG. 1 is a block diagram of a prior art power rail coupling for an output buffer circuit.
Figure 2:
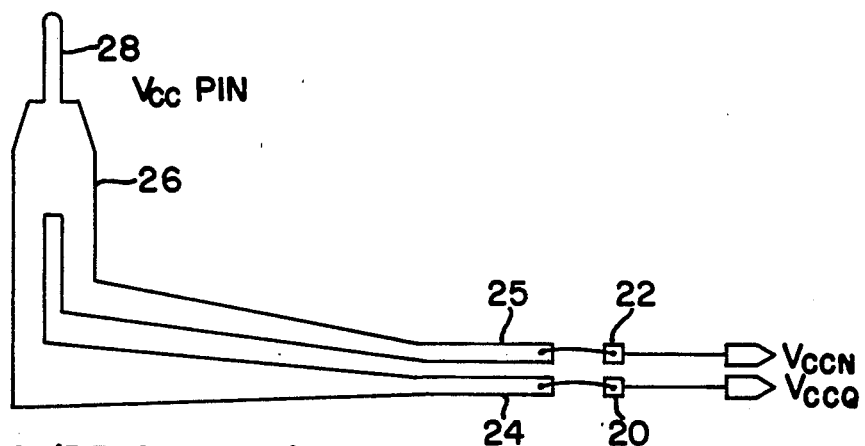
FIG. 2 is a diagrammatic plan view of the prior art power supply rail coupling using a split lead leadframe configuration.
Figure 2A:
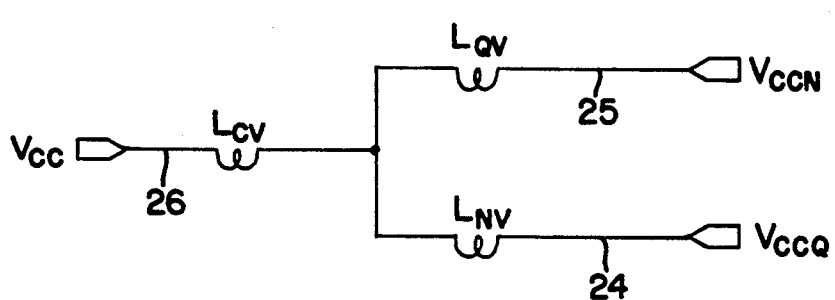
FIG. 2A is an equivalent schematic circuit diagram of the power supply rail coupling of FIG. 2.
Figure 3:
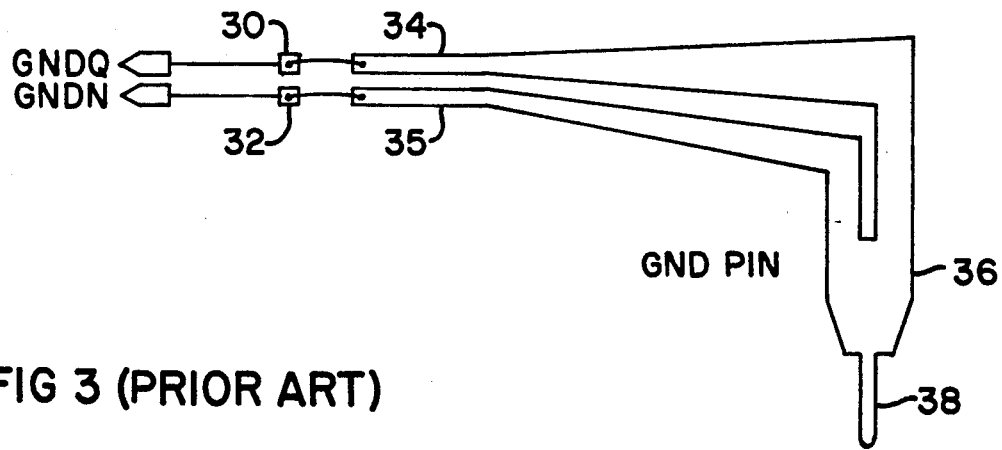
FIG. 3 is a diagrammatic plan view of the prior art power ground rail coupling using a split lead leadframe configuration.
Figure 4:
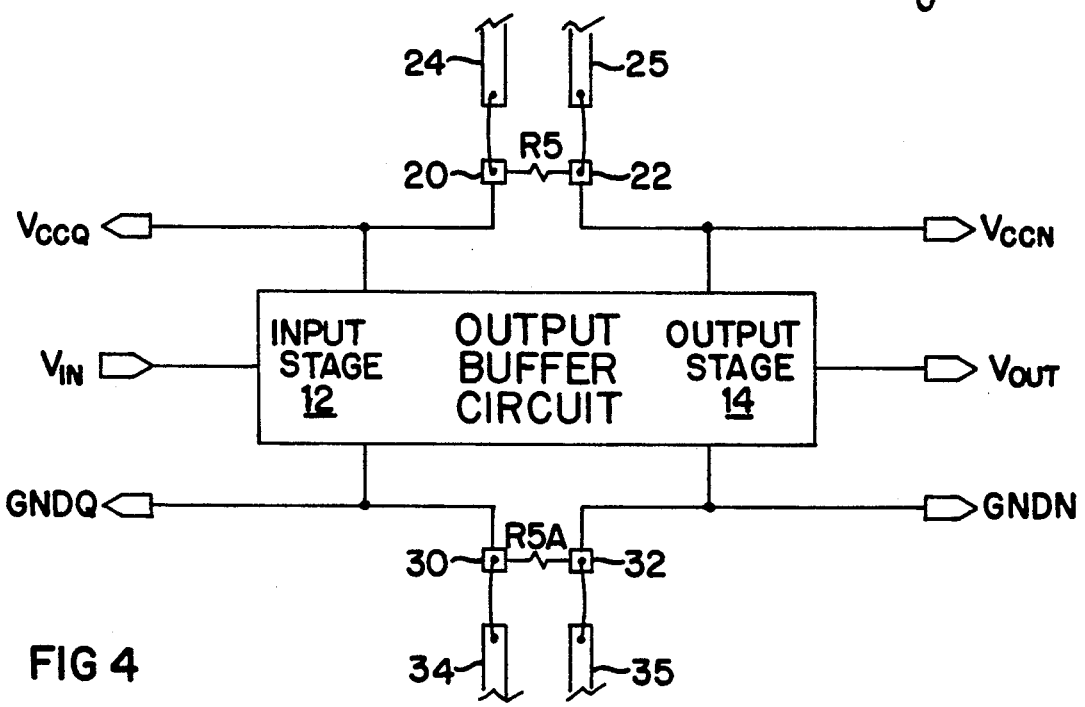
FIG. 4 is a schematic circuit block diagram of the power rail coupling for an output buffer circuit according to the invention.
Figure 5:
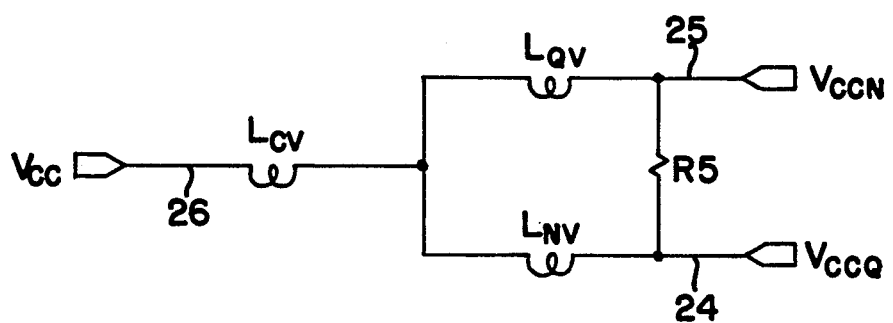
FIG. 5 is an equivalent schematic circuit diagram of the power supply rail coupling of FIG. 4.
Figure 6:
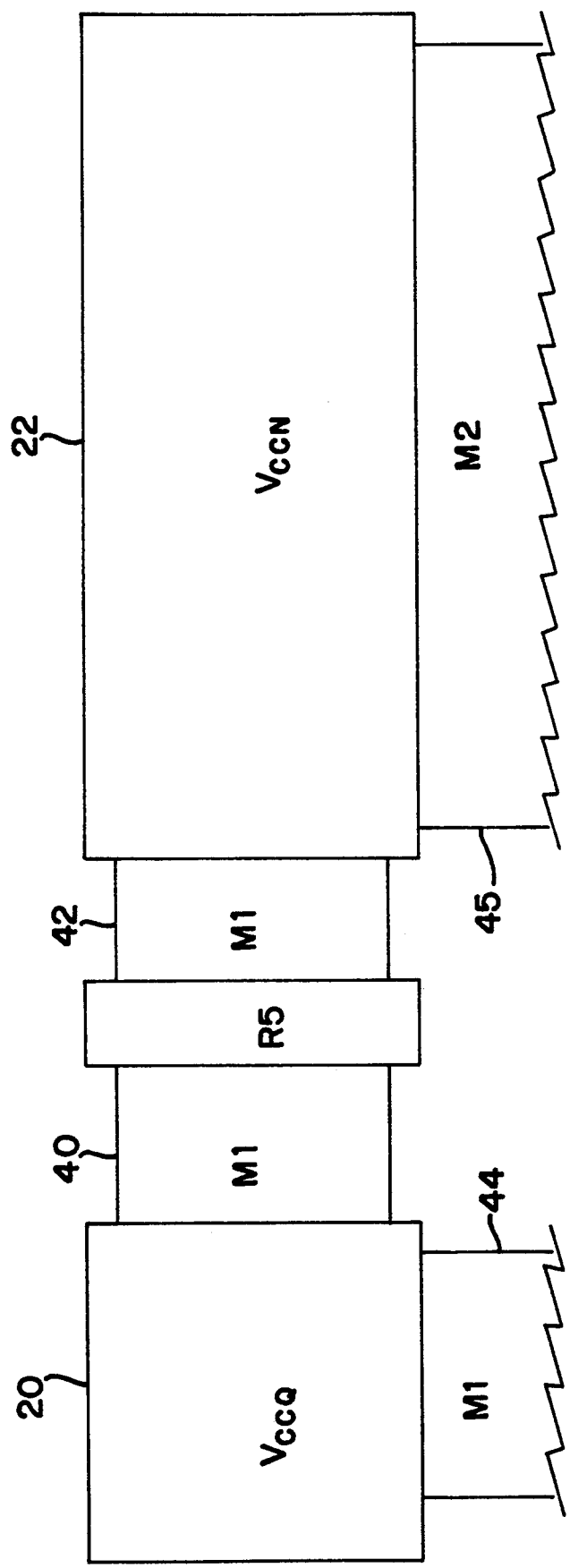
FIG. 6 is a plan view of an integrated circuit mask layout diagram of the power supply rail coupling of FIG. 4.
Figure 7:
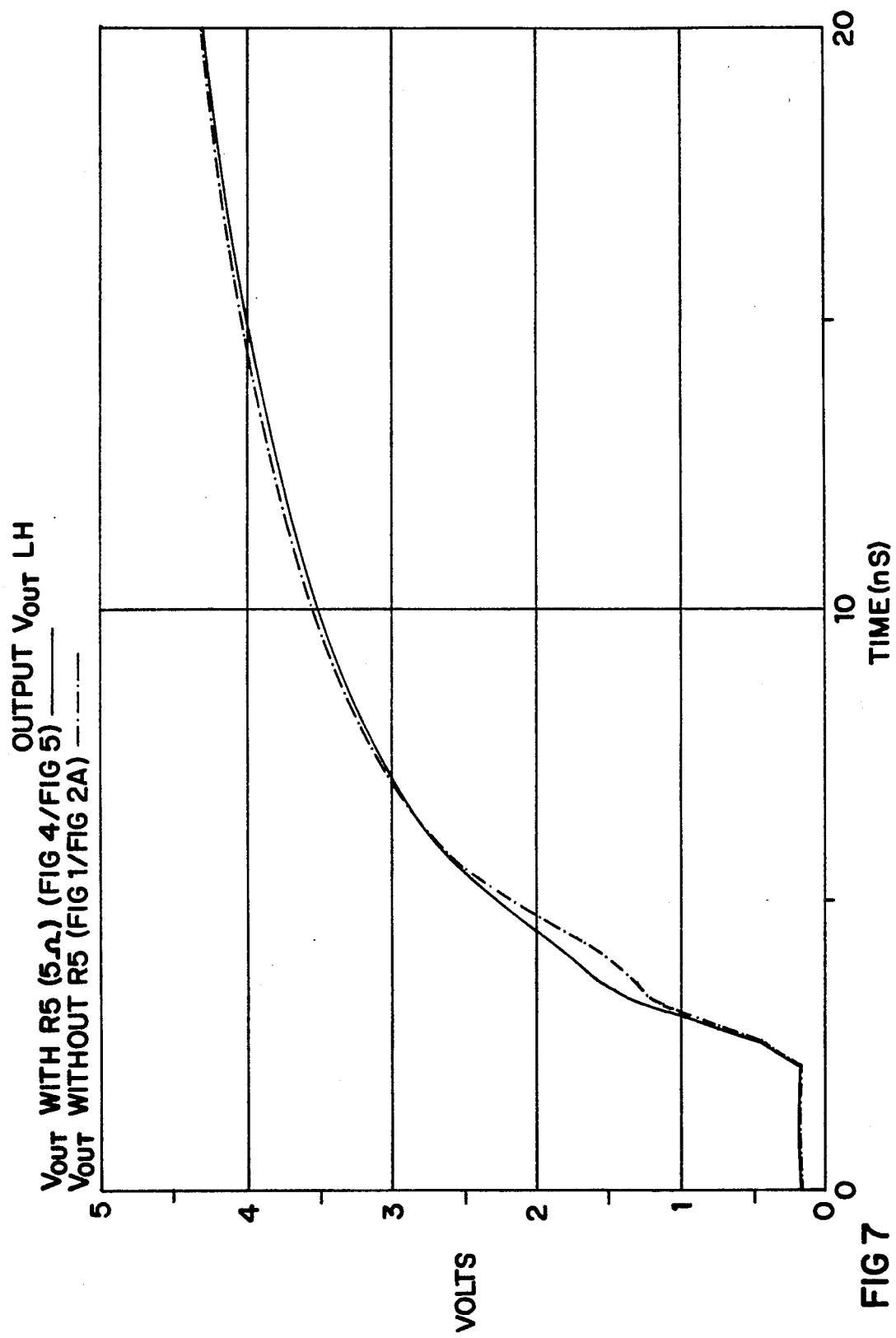
FIG. 7 is a graph comparing the low to high LH transition output voltage wave forms for the circuits of FIG. 1 and FIG. 4 and showing reduction in the output step achieved by the circuit of FIG. 4.

An output buffer circuit power rail coupling according to the invention is illustrated in FIGS. 4–6. Circuit components forming substantially the same circuit function as illustrated in FIGS. 1–3 are indicated by the same reference numeral or reference designation. In the circuit of FIG. 4 there is added a first coupling resistor R5 coupled between the relatively quiet and noisy power supply rails $V_{CCQ}$, $V_{CCN}$. The coupling resistor R5 has a low resistance value selected for partially coupling the supply rails in a parallel coupling to reduce parasitic inductance which in turn reduces $V_{CC}$ crash on the noisy power supply rail $V_{CCN}$. Reduction in $V_{CC}$ crash or $V_{CC}$ droop reduces the output step in voltage during low to high LH transition at the output $V_{OUT}$ as illustrated in the graph of FIG. 7. The first coupling resistor R5 also provides sufficient isolation between the relatively quiet and noisy power supply rails to maintain the input dynamic threshold voltage levels $V_{IHD}$, $V_{ILD}$ of other non-switching quiet output buffer circuits coupled to the common bus within acceptable limits.

As shown in FIGS. 2 and 6, the relatively quiet and noisy power supply rails $V_{CCQ}$, $V_{CCN}$ are coupled respectively to spaced apart bond pads 20,22. The first coupling resistor R5 is coupled between the supply rail bond pads 20,22. As shown in the equivalent schematic circuit diagram of FIG. 5 the first coupling resistor R5 provides a partial parallel coupling between the split leads 24,25 to reduce parasitic lead inductance and $V_{CC}$ droop.

A sample layout of the power supply rail coupling is illustrated in FIG. 6. An N+ implant resistor R5 is coupled to respective quiet and noisy supply bond pads $V_{CCQ}$, $V_{CCN}$ by metal layer M1 leads 40,42. The relatively noisy power supply rail $V_{CCN}$ is coupled to bond pad 22 through metal layer M2 lead 45. The relatively quiet power supply rail $V_{CCQ}$ is coupled to bond pad 20 through metal layer M1 lead 44.

A similar power rail coupling may be provided on the ground rail side of the output buffer circuit also. As illustrated in FIG. 4, a second coupling resistor R5A is coupled between the relatively quiet and noisy power ground rails GNDQ,GNDN. The second coupling resistor R5A has a low resistance value selected for partially coupling the ground resistance value selected for partially coupling the ground rails to reduce ground bounce on the noisy ground rail GNDN. This in turn reduces output step in voltage during high to low LH transitions at the output $V_{OUT}$. The second coupling resistor R5A also partially isolates the relatively quiet and noisy ground rails GNDQ,GNDN to maintain input dynamic threshold voltage levels $V_T$, $V_{IHD}$, $V_{ILD}$ for other non-switching quiet output buffer circuits coupled to the common bus.

The relatively quiet and noisy power ground rails GNDQ,GNDN are coupled to respective bond pads 30,32. The second coupling resistor R5A is preferably coupled between the ground rail bond pads 30,32. A typical resistance value for the first and second coupling resistors R5,R5A is, for example 5 ohms.

The advantage of the circuit of FIG. 4 and FIG. 5 over a power rail coupling with no isolation is illustrated in the graph of FIG. 8. In this graph the output voltage at a quiet or non-switching output $V_{QOUT}$ according to the power rail coupling of FIG.4/FIG.5 is compared with the output voltage at a quiet or non-switching output $V_{QOUT}$ in which the split leads are shorted together. With a high potential level signal H held at each of the quiet outputs $V_{QOUT}$, the quiet output without isolation of relatively quiet and noisy power rails falls below the 2 volt specifications constituting a failure. The quiet output $V_{QOUT}$ with partial isolation according to the circuit of FIG.4/FIG.5 maintains the high voltage level signal H within the permitted range.

While the invention has been described with reference to particular example embodiments it is intended to cover all modifications and equivalents within the scope of the following claims.

We claim:

1. A power rail coupling for an output buffer circuit having an output coupled to a common bus with other output buffer circuits, said output buffer circuit having relatively quiet and relatively noisy power supply rails coupled respectively to input and output stages of the output buffer circuit comprising:

a first coupling resistor coupled between the relatively quiet and noisy power supply rails and having a low resistance value selected for partially coupling said supply rails to reduce crash on the noisy power supply rail and thereby reduce output step in voltage during low to high transitions at the output, said first coupling resistor partially isolating said relatively quiet and noisy power supply rails to maintain input dynamic threshold voltage levels of other non-switching quiet output buffer circuits coupled to the common bus.

2. The power rail coupling of claim 1 wherein the relatively quiet and noisy power supply rails are coupled respectively to spaced apart bond pads, and wherein the first coupling resistor is coupled between said supply rail bond pads.

3. The power rail coupling of claim 1 wherein the output buffer circuit comprises relatively quiet and relatively noisy power ground rails coupled respectively to said input and output stages of the output buffer circuit, and further comprising:
  a second coupling resistor coupled between the relatively quiet and noisy power ground rails and having a low resistance value selected for partially coupling said ground rails to reduce ground bounce on the noisy ground rail and thereby reduce output step in voltage during high to low transition at the output, said second coupling resistor partially isolating said relatively quiet and noisy ground rails to maintain input dynamic threshold levels for other non-switching quiet output buffer circuits coupled to the common bus.

4. The power rail coupling of claim 3 wherein the relatively quiet and noisy power ground rails are coupled to respective spaced apart bond pads and wherein said second coupling resistor is coupled between said ground rail bond pads.

5. The output buffer circuit of claim 2 wherein the power supply rail bond pads are coupled to split leads of a split lead leadframe merging to a common pin.

6. The output buffer circuit of claim 2 wherein the power supply rail bond pads are coupled to separate leadframe fingers of a leadframe.

7. The power rail coupling of claim 4 wherein the ground rail bond pads are coupled respectively to the split leads of a split lead leadframe merging to a common GND pin.

8. An output buffer circuit for delivering output signals of high and low potential levels at an output in response to data signals at an input, said output buffer circuit comprising an input stage coupled between a relatively quiet power supply rail and a relatively quiet power ground rail, and an output stage coupled between a relatively noisy power supply rail and a relatively noisy power ground rail, the improvement for reducing droop in the relatively noisy supply rail for reducing output step in voltage during transition from low to high potential level at the output comprising:
  a first coupling resistor coupled between the relatively quiet and noisy supply rails, said resistor having a low resistance value selected for partially coupling said supply rails while maintaining partial isolation for maintaining input dynamic threshold levels of other non-switching quiet output buffer circuits coupled to a common bus.

9. The output buffer circuit of claim 8 comprising a second coupling resistor coupled between the relatively quiet and noisy ground rails, said second coupling resistor having a low resistance value selected for partially coupling said ground rails while maintaining partial isolation for maintaining input dynamic threshold levels for other non-switching quiet output buffer circuits coupled on a common bus.

10. The output buffer circuit of claim 8 wherein the relatively quiet and noisy supply rails are coupled to respective spaced apart bond pads and wherein the first coupling resistor is coupled between said supply rail bond pads.

11. The output buffer circuit of claim 9 wherein the relatively quiet and noisy power ground rails are coupled to respective spaced apart bond pads and wherein the second coupling resistor is coupled between said ground rail bond pads.

12. The output buffer circuit of claim 9 wherein the supply rail bond pads are coupled respectively to split leads of a split lead leadframe merging to a common pin.

13. The output buffer circuit of claim 11 wherein the ground rail bond pads are coupled respectively to split leads of a split lead leadframe merging at a common GND pin.

14. A power rail coupling for an output buffer circuit having an output coupled to a common bus with other output buffer circuits, said output buffer circuit having relatively quiet and relatively noisy power ground rails coupled respectively to input and output stages of the output buffer circuit comprising:
  a coupling resistor coupled between the relatively quiet and noisy power ground rails and having a low resistance value selected for partially coupling said ground rails to reduce ground bounce on the noisy power ground rail thereby reducing output step in voltage during high to low transition at the output, said coupling resistor partially isolating said relatively quiet and noisy ground rails to maintain input dynamic threshold levels for other non-switching quiet output buffer circuits coupled to the common bus.

15. The power rail circuit of claim 14 wherein the relatively quiet and noisy ground rails are coupled to respective spaced apart bond pads and wherein the coupling resistor is coupled between said ground rail bond pads.

16. The power rail circuit of claim 15 wherein the ground rail bond pads are coupled respectively to split leads of a split lead leadframe merging at a common GND pin.

17. An output buffer circuit for delivering output signals of high and low potential levels at an output in response to data signals at an input, said output buffer circuit comprising an input stage coupled between a relatively quiet power supply rail and a relatively quiet power ground rail, and an output stage coupled between a relatively noisy power supply rail and a relatively noisy power ground rail, the improvement for reducing droop in the relatively noisy supply rail for reducing output step in voltage during transition from low to high potential level at the output comprising:
  a coupling resistor coupled between the relatively quiet and noisy ground rails, said coupling resistor having a low resistance value selected for partially coupling said ground rails to reduce ground bounce and thereby reduce output step in voltage during high to low transitions at the output, said coupling resistor partially isolating the relatively quiet and noisy ground rails for maintaining input dynamic threshold levels for other non-switching quiet output buffer circuits coupled to a common bus.

18. The output buffer circuit of claim 17 comprising a second coupling resistor coupled between the relatively quiet and noisy supply rails, said second coupling resistor having a low resistance value selected for partially coupling said supply rails while maintaining partial isolation for protecting input dynamic threshold levels for other non-switching quiet output buffer circuits coupled on a common bus.

19. The output buffer circuit of claim 17 wherein the relatively quiet and noisy power ground rails are coupled to respective spaced apart bond pads and wherein the second coupling resistor is coupled between said ground rail bond pads.

20. The output buffer circuit of claim 19 wherein the ground rail bond pads are coupled respectively to split leads of a split lead leadframe merging at a common GND pin.

* * * * *